Figure 1:
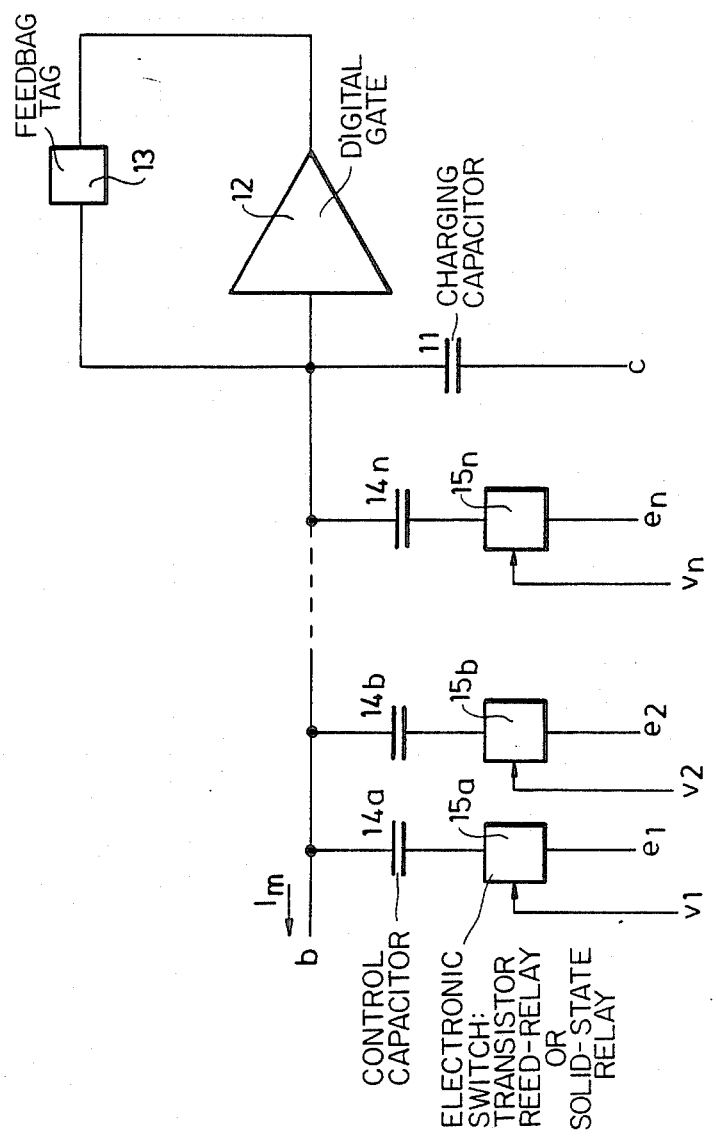

United States Patent [19]

Szabó et al.

[11] Patent Number: 4,694,208

[45] Date of Patent: Sep. 15, 1987

[54] CURRENT-IMPULSE CONVERTER CIRCUIT WITH VARIABLE TIME CONSTANT

[75] Inventors: Béla Szabó; Jeno Vágvölgyi; István Fehér, all of Budapest, Hungary

[73] Assignee: MTA Kozponti Fizikai Kutato Intezete, Budapest, Hungary

[21] Appl. No.: 760,724

[22] PCT Filed: Oct. 5, 1984

[86] PCT No.: PCT/HU84/00046

§ 371 Date: May 22, 1985

§ 102(e) Date: May 22, 1985

[87] PCT Pub. No.: WO85/01847

PCT Pub. Date: Apr. 25, 1985

[30] Foreign Application Priority Data

Oct. 7, 1983 [HU] Hungary .................. 3471-83

[51] Int. Cl.$^4$ .............. H03K 5/13; G06G 7/18; H03F 1/02; H03M 1/00
[52] U.S. Cl. .................. 307/603; 307/595; 328/127; 330/9
[58] Field of Search ............. 307/602, 603, 595, 490; 328/127, 128; 333/165; 330/9

[56] References Cited

U.S. PATENT DOCUMENTS

| | | | |
|---|---|---|---|
| 3,497,724 | 2/1970 | Harper | 328/128 |
| 3,581,300 | 5/1971 | Eloranta | 307/602 |
| 3,783,392 | 1/1974 | Drake et al. | 328/128 |
| 4,100,515 | 7/1978 | Gupta | 328/127 |

*Primary Examiner*—Stanley D. Miller
*Assistant Examiner*—B. P. Davis
*Attorney, Agent, or Firm*—Young & Thompson

[57] ABSTRACT

Circuit arrangement intended for evaluating currents of 7 or 8 orders of magnitude, particularly in thermoluminescent dosemeter (TLD) evaluation equipment, which comprises a digital gate (12) with a feedback tag (13) and a charging capacitor (11) connected to the input of the digital gate (12). The other terminal of the charging capacitor (11) is connected to a stable voltage line, practically to ground. For varying the time constant the circuit arrangement has at least one control capacitor (14a to 14n) connected serially with corresponding electronic switches (15a to 15n). The other terminal of the control capacitors (14a to 14n) are connected to the input of the digital gate, through the input line (b) of the circuit arrangement. The switching inputs of the electronic switches are connected to control lines (v1 to vn), while other terminals of them are connected to stabilized voltage lines (e1 to en). For achieving decadic ranges of measurement the values of the control capacitors (14a to 14n) are either $9.10^K$-multiples or $101^K - 1$ multiples of the value of the charging capacitor (11). The electronic switches (15a to 15n) are switched off in their original position. The operating speed of the converter increases proportionally with the current $I_m$ to be measured and when it reaches its upper limit one of the switches (15a to 15n) will be switched on, thus the time constant increases and the operating speed decreases accordingly. If needed, a further or another control capacitor (14a to 14n) will be switched on.

2 Claims, 2 Drawing Figures

CURRENT-IMPULSE CONVERTER CIRCUIT WITH VARIABLE TIME CONSTANT

The subject of the invention is a circuit arrangement for the development of a current-impulse converter with variable time constant.

In scientific and technical practice it is very often necessary to process analog signals, e.g. current, digitally in a wide measuring range. There are many types of A/D converters for this purpose. In special cases, e.g. for a thermoluminescent dosimeter evaluation equipment for measuring environmental dose levels or accidental levels, we have to convert the current of the photomultiplier tube—which is proportional to the light of the dosimeter—to digital signals (impulses) in the range of 7–8 orders (from 0.1–1 pA to 1–10 μA).

The current-impulse converter of an ionization chamber type dosimeter is required to work in a similar range. These converters are of complex structure, require more supply voltages, and their power consumption is by no means negligible.

However, with a small, portable, battery fed thermoluminescent dosimeter (TLD) evaluation equipment, a simple structure, high reliability, low power consumption current-impulse converter is required, which can cover 7–8 orders of magnitude with appropriate accuracy.

Hungarian patent description No. 180.858 introduces a current-impulse converter of simple structure like this. It consists of a charging capacitor, a digital gate connected to it, and a feedback means between the capacitor and the output of the gate. The disadvantage of this solution is that the switching speed of the applied active devices—digital gate, feedback means—is limited so the operating range of this current-impulse converter is not more than 5 orders.

The purpose of the invention is to develop a circuit arrangement which retains all the advantages of the above described invention and eliminates most of its disadvantages.

In accordance with this, the task to be solved by this invention is to develope a solution for current-impulse conversion through a measuring range of 7–8 orders.

The invention is based on the principle that by altering the time constant of the current-impulse converter its operating speed is modified and the switching speed of the active elements does not limit it. Therefore if we increase the time constant of the converter at a given operating speed, then—if this step is repeated more—the operating range is expanded by more orders.

The circuit arrangement according to the invention is the improvement of another well-known solution, which has a digital gate, feedback means and charging capacitor, and whose output of the digital gate is connected to the input of the feedback means, and whose input of the digital gate is connected to the charging capacitor and to the output of the feedback means.

The improvement, namely the invention is that this circuit arrangement has at least one control capacitor and serially-connected electronic switch, the other pole/s of the control capacitor/s is/are connected to the input of the digital gate through the input line, the switching input/s of the electronic switch/es is /are connected to control line/s, other input/s of it /them is/are connected to a stabilized voltage line/s.

In the sense of the invention it is practical if the electronic swith is/are transistor/s, reed relay/s or solid state relay/s.

Namely it is practical if the value of the control capacitor/s applied in the invention is $9 \times 10^K$ times more than the value of the charging capacitor, where K is an integer, or one less than an integer power of ten.

Moreover it is practical if the stabilized voltage line/s is/are connected together with the stable voltage line/s.

The invention is presented in more detail by the accompanying drawings, in which we indicate the circuit arrangement according to the invention and its timing diagram.

Figure 2:
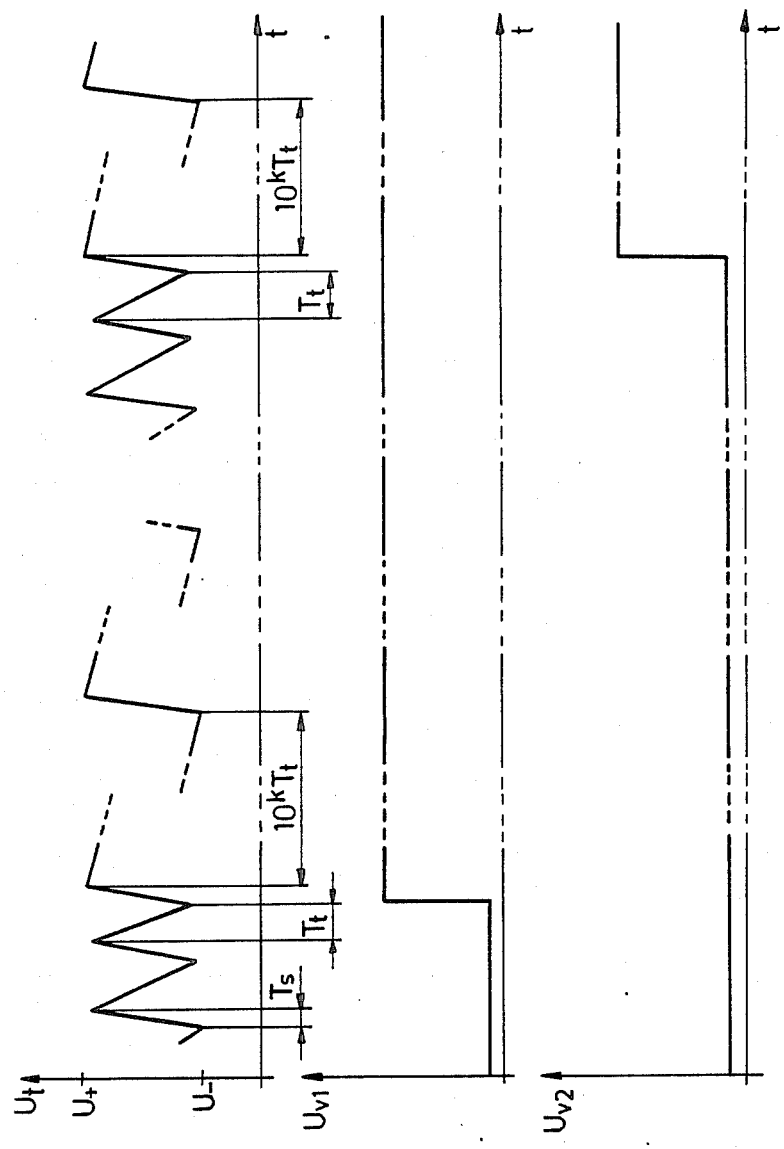

FIG. 1 is a schematic diagram of the current-impulse converter with variable time constant according to the invention FIG. 2 is a timing diagram according to the arrangement of FIG. 1.

The structure of the circuit arrangement shown in FIG. 1 is as follows: the $14a$–$14n$ control capacitor/s and $15a$–$15n$ electronic switches connected into chain are connected to the input line b of the current-impulse converter constructed of the charging capacitor 11, digital gate 12 and feedback means 13. The other poles of electronic switches $15a$–$15n$ are connected to stabilized voltage lines e1–en. The inputs of the electronic switches are connected to control lines v1–vn.

The circuit operation can easily be understood on the basis of the timing diagram shown in FIG. 2. The electronic switches $15a$–$15n$ are opened in their original position, so the control capacitors $14a$–$14n$ have no effect on the operation of the current-impulse converter. The operating speed of the converter increases proportionally with the current to be measured $I_m$. If the operating speed reaches its upper limit, which is determined by the limiting switching time of the active elements applied in the circuit, the switching on of electronic switch $15a$ takes place through the control line v1. The upper limit of the said operating speed is determined by the switching time of the active elements $T_s$, the charging time $T_t$ of the charging capacitor 11, and the permitted uncertainty of the measurement $\theta\%$ derived from it.

The $f_{max}$ maximum speed (imp.s$^{-1}$) is $$f_{max} = \frac{1}{T_t} = \frac{\theta}{100 \, T_s}$$

During the switching the electronic switch $15a$ connects the control capacitor $14a$ to the stabilized voltage line e1, whereby the time constant of the circuit increases $10^K$ times, or otherwise the operating speed is reduced $10^K$ times. It can be seen from FIG. 2 that whereas at the moment before switching the charging cycle took time $T_t$, after switching it takes $10^K \cdot T_t$.

If we thus increase the current to be measured $I_m$, the operating speed of the converter also increases and the switching on of electronic switches $15b$, $15c$, ..., $15n$ successively takes place through the control lines v2, v3, ..., vn. According to these the time constant of the circuit will increase, in turn, $10^{2K}$, $10^{3K}$, ..., $10^{nK}$ times.

After switching on electronic switch $15n$, the charging cycle on the charging capacitor 11 will also require $10^K \cdot T_t$ time again, as is shown in FIG. 2.

For example, let the value of the charging capacitor 11 be 10 pF, the upper voltage limit $U_t$ of the charging cycle be 5 V, the lower voltage limit $U_-$ be 2 V and the total switching time $T_s$ of the digital gate 12 and the feedback means 13 be 500 ns, the measuring uncertainty $\theta\%$ be 1%.

Hence, the speed $f_{max}$ is given by:

$$f_{max} = \frac{1}{100 \cdot 500 \cdot 10^{-9}} = 20 \text{ kHz}$$

It means that the maximum current to be measured is $$I_m f_{max}./U_+ - U_-/.10.10^{-12} = 0.6 \text{ } \mu A$$

If the value of K is 1, the measuring range of the converter may be expanded to t $\mu$A, 60 $\mu$A ... and so on, depending on the number of the control capacitors 14a-14n.

Likewise we introduce a further example for realization of the circuit arrangement on the basis of FIG. 1, where the electronic switches 15a-15n are transistors, reed relays or solid state relays.

If we apply PNP transistors as electronic switches 15a-15n then the collector terminals of the transistors are connected to the control capacitors 14a-14n, the emitter terminals are connected to the stabilized voltage lines e1-en, which are practically the same with the supply voltage line. The inputs will be the bases, which have to be connected in turn to the control lines v1-vn, on which comes the negative signal to operate the switches.

If we apply NPN transistors, then it is practical to connect the emitters to the stable voltage line, which is the same with the ground. In this case the signal to operate the switch/es/ is positive.

If we apply reed relays, each reed contact are connected to the control capacitor 14a-14n, the others are practically connected to the stable voltage line C which is the same as the ground. The inputs of the reed switches—namely the pulling coil—are between the ground and the control lines v1-vn, on which comes the negative or positive signal to operate the switches.

The advantages of the current-impulse converter according to the invention may be summarized as follows:

the circuit is very simple,
there are few elements,
it can with high reliability perform the extension of the operation range of a current-impulse converter by more orders (at least 2).

We claim:

1. A current-impulse converter, comprising: a digital gate for converting an input current to an output train of impulses, said gate having a limited switching speed; feedback means having an input connected to the output of said digital gate and an output connected to an input line of said digital gate; a charging capacitor having a first terminal connected to said input line of said digital gate and a second terminal connected to a stable voltage line; at least one control capacitor and at least one electronic switch; each said at least one control capacitor having a first terminal connected to said input line of said digital gate upstream of said charging capacitor, and a second terminal connected to a first terminal of a said electronic switch, each said at least one electronic switch further comprising a second terminal connected to a control input line and a third terminal connected to a stabilized voltage line.

2. Converter according to claim 1, wherein each said at least one electronic switch is selected from the group consisting of transistors, reed-relays and solid-state relays.

* * * * *